(12) United States Patent
El Baraji et al.

(10) Patent No.: US 8,611,140 B2
(45) Date of Patent: Dec. 17, 2013

(54) MAGNETIC RANDOM ACCESS MEMORY DEVICES INCLUDING SHARED HEATING STRAPS

(75) Inventors: Mourad El Baraji, Sunnyvale, CA (US); Neal Berger, Cupertino, CA (US)

(73) Assignee: Crocus Technology Inc., Sunnyvale, CA (US)

( * ) Notice: Subject to any disclaimer, the term of this patent is extended or adjusted under 35 U.S.C. 154(b) by 0 days.

(21) Appl. No.: 13/239,162

(22) Filed: Sep. 21, 2011

(65) Prior Publication Data
US 2013/0070520 A1 Mar. 21, 2013

(51) Int. Cl.
*G11C 11/16* (2006.01)

(52) U.S. Cl.
USPC .......................................... 365/158; 365/173

(58) Field of Classification Search
USPC .................................. 365/158, 173
See application file for complete search history.

(56) References Cited

U.S. PATENT DOCUMENTS

| | | | |
|---|---|---|---|
| 7,985,963 B2 * | 7/2011 | Rinerson et al. ................... 257/4 |
| 8,289,765 B2 | 10/2012 | Javerliac et al. |
| 8,385,107 B2 | 2/2013 | Prejbeanu |
| 2002/0089874 A1 | 7/2002 | Nickel et al. |
| 2006/0215444 A1 | 9/2006 | Perner et al. |
| 2007/0008793 A1 * | 1/2007 | Hirobe ........................... 365/194 |
| 2008/0160641 A1 | 7/2008 | Min et al. |
| 2009/0059702 A1 * | 3/2009 | Sekiguchi et al. ............. 365/205 |
| 2009/0231906 A1 * | 9/2009 | Rinerson et al. ............... 365/151 |
| 2009/0316476 A1 | 12/2009 | Javerliac et al. |
| 2010/0110744 A1 | 5/2010 | El Baraji et al. |
| 2010/0208516 A1 | 8/2010 | Javerliac et al. |
| 2011/0002151 A1 * | 1/2011 | Javerliac et al. ................. 365/50 |
| 2011/0110151 A1 | 5/2011 | Prejbeanu |
| 2012/0008383 A1 | 1/2012 | Gapihan et al. |
| 2012/0201073 A1 | 8/2012 | Berger et al. |
| 2012/0314488 A1 | 12/2012 | El Baraji et al. |
| 2013/0070521 A1 | 3/2013 | El Baraji et al. |

OTHER PUBLICATIONS

International Search Report and Written Opinion issued to International Application No. PCT/US12/55995, Nov. 30, 2012, 8 pgs.
International Search Report and Written Opinion issued to International Patent Application No. PCT/US2012/056000, Nov. 23, 2012, 8 pgs.
Office Action issued to U.S. Appl. No. 13/239,168, Mar. 29, 2013, 9 pgs.

* cited by examiner

*Primary Examiner* — Michael Tran
(74) *Attorney, Agent, or Firm* — Cooley LLP

(57) ABSTRACT

A memory device includes: (1) multiple magnetic random access memory ("MRAM") cells each including a first end and a second end; (2) a bit line electrically coupled to the first end of at least one of the MRAM cells; and (3) a strap electrically coupled to the second end of each one of the MRAM cells. During a write operation, the bit line is configured to apply a first heating current, and the strap is configured to apply a second heating current, such that at least one of the MRAM cells is heated to at least a threshold temperature according to the first heating current and the second heating current.

25 Claims, 5 Drawing Sheets

MAGNETIC RANDOM ACCESS MEMORY DEVICES INCLUDING SHARED HEATING STRAPS

FIELD OF THE INVENTION

The invention relates generally to magnetic random access memory ("MRAM") devices. More particularly, the invention relates to MRAM devices including shared heating straps.

BACKGROUND

MRAM devices have become the subject of increasing interest, in view of the discovery of magnetic tunnel junctions having a strong magnetoresistance at ambient temperatures. MRAM devices offer a number of benefits, such as faster speed of writing and reading, non-volatility, and insensitivity to ionizing radiations. Consequently, MRAM devices are increasingly replacing memory devices that are based on a charge state of a capacitor, such as dynamic random access memory devices and flash memory devices.

In a conventional implementation, a MRAM device includes an array of MRAM cells, each of which includes a magnetic tunnel junction formed of a pair of ferromagnetic layers separated by a thin insulating layer. One ferromagnetic layer, the so-called reference layer, is characterized by a magnetization with a fixed direction, and the other ferromagnetic layer, the so-called storage layer, is characterized by a magnetization with a direction that is varied upon writing of the device, such as by applying a magnetic field. When the respective magnetizations of the reference layer and the storage layer are antiparallel, a resistance of the magnetic tunnel junction is high, namely having a resistance value $R_{max}$ corresponding to a high logic state "1". On the other hand, when the respective magnetizations are parallel, the resistance of the magnetic tunnel junction is low, namely having a resistance value $R_{min}$ corresponding to a low logic state "0". A logic state of a MRAM cell is read by comparing its resistance value to a reference resistance value $R_{ref}$, which represents an in-between resistance value between that of the high logic state "1" and the low logic state "0".

In a conventional MRAM cell that is implemented for thermally assisted switching ("TAS"), a storage layer is typically exchange biased by an antiferromagnetic layer, which is adjacent to the storage layer within a magnetic tunnel junction and is characterized by a threshold temperature. Below the threshold temperature, a magnetization of the storage layer is pinned by the exchange bias, thereby inhibiting writing of the storage layer. Writing is carried out by passing a current through the magnetic tunnel junction, thereby heating the magnetic tunnel junction above the threshold temperature and unpinning the magnetization of the storage layer. The magnetic tunnel junction is then cooled to below the threshold temperature with a magnetic field applied, such that the magnetization of the storage layer is "frozen" in the written direction.

While offering a number of benefits, a conventional TAS-type MRAM device suffers from certain deficiencies. Specifically, a current that is passed through a magnetic tunnel junction should be of sufficient magnitude to heat the magnetic tunnel junction above a threshold temperature, which can be about 120° C. or higher. However, passing a current of such magnitude through the magnetic tunnel junction can create stresses on an insulating layer within the magnetic tunnel junction, and repeated writing operations can degrade the insulating layer and reduce an operational life of the MRAM device.

It is against this background that a need arose to develop the MRAM devices and related methods described herein.

SUMMARY

One aspect of the invention relates to a memory device. In one embodiment, the memory device includes: (1) multiple MRAM cells each including a first end and a second end; (2) a bit line electrically coupled to the first end of at least one of the MRAM cells; and (3) a strap electrically coupled to the second end of each one of the MRAM cells. During a write operation, the bit line is configured to apply a first heating current, and the strap is configured to apply a second heating current, such that at least one of the MRAM cells is heated to at least a threshold temperature according to the first heating current and the second heating current.

Another aspect of the invention relates to a method of operating a memory device. In one embodiment, the method includes providing multiple MRAM cells and a strap thermally coupled to each one of the MRAM cells. The method also includes, during a write operation, (1) heating each one of the MRAM cells to at least a threshold temperature such that storage magnetization directions of the MRAM cells are temporarily unpinned, where heating the MRAM cells includes applying a heating current through the strap; and (2) switching the storage magnetization directions of the MRAM cells to store a multi-bit data value.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like features, unless the context clearly dictates otherwise.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical manufacturing tolerances or variability of the embodiments described herein.

As used herein, the term "adjacent" refers to being near or adjoining. Adjacent objects can be spaced apart from one another or can be in actual or direct contact with one another. In some instances, adjacent objects can be coupled to one another or can be formed integrally with one another.

As used herein, the terms "couple," "coupled," and "coupling" refer to an operational connection or linking. Coupled objects can be directly connected to one another or can be indirectly connected to one another, such as via another set of objects.

As used herein, the term "main group element" refers to a chemical element in any of Group IA (or Group 1), Group IIA (or Group 2), Group IIIA (or Group 13), Group IVA (or Group 14), Group VA (or Group 15), Group VIA (or Group 16), Group VIIA (or Group 17), and Group VIIIA (or Group 18). A main group element is also sometimes referred to as a s-block element or a p-block element.

As used herein, the term "transition metal" refers to a chemical element in any of Group IVB (or Group 4), Group VB (or Group 5), Group VIB (or Group 6), Group VIIB (or Group 7), Group VIIIB (or Groups 8, 9, and 10), Group IB (or Group 11), and Group IIB (or Group 12). A transition metal is also sometimes referred to as a d-block element.

As used herein, the term "rare earth element" refers to any of Sc, Y, La, Ce, Pr, Nd, Pm, Sm, Eu, Gd, Tb, Dy, Ho, Er, Tm, Yb, and Lu.

MRAM Devices

Figure 1A:
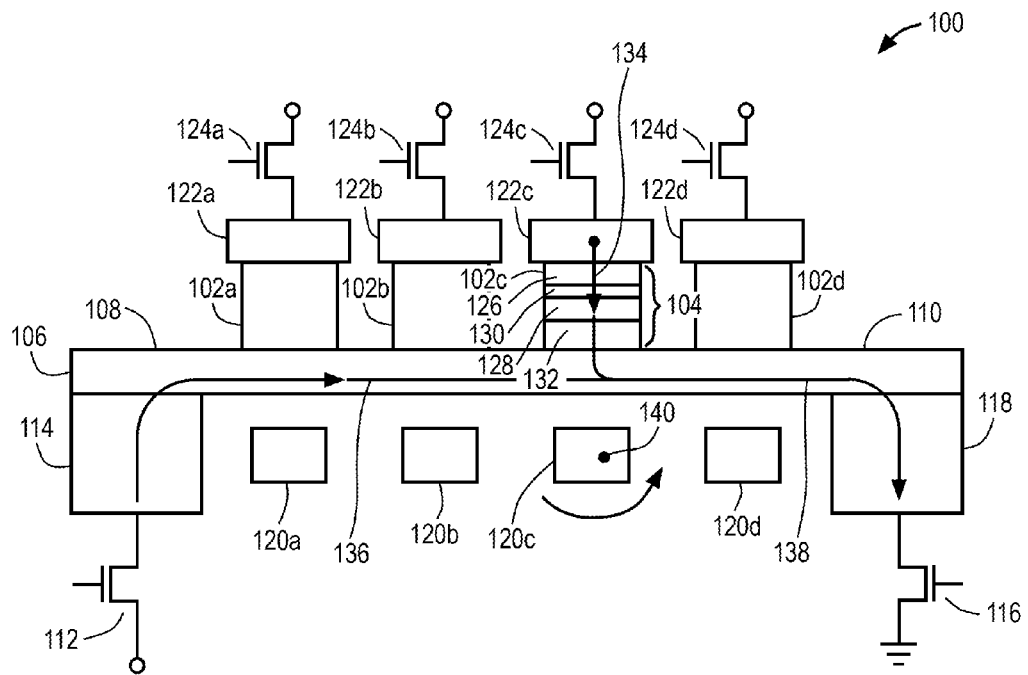
FIG. 1A and FIG. 1B illustrate a MRAM device implemented in accordance with an embodiment of the invention.
Figure 1B:
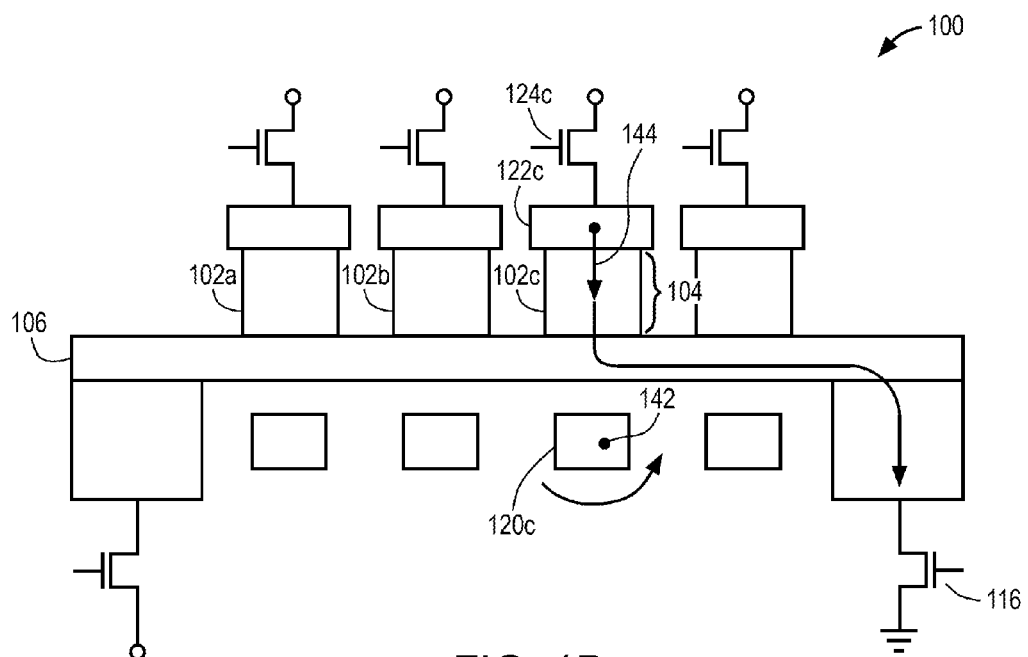

Attention first turns to FIG. 1A and FIG. 1B, which illustrate a memory device implemented in accordance with an embodiment of the invention. In the illustrated embodiment, the memory device is a MRAM device 100 that includes a set of MRAM cells 102a, 102b, 102c, and 102d. Each of the MRAM cells 102a, 102b, 102c, and 102d includes a magnetic tunnel junction, such as a magnetic tunnel junction 104 included in the MRAM cell 102c. Referring to FIG. 1A and FIG. 1B, the MRAM cells 102a, 102b, 102c, and 102d are arranged in a horizontal array and in a side-by-side fashion adjacent to a strap 106, which serves as a common strap that is shared by the MRAM cells 102a, 102b, 102c, and 102d. The implementation of such shared strap conserves valuable die area, lowers manufacturing costs, and facilitates parallel operations. While the four MRAM cells 102a, 102b, 102c, and 102d are illustrated in FIG. 1A and FIG. 1B, it is contemplated that more or less MRAM cells can be included in the MRAM device 100.

In the illustrated embodiment, each of the MRAM cells 102a, 102b, 102c, and 102d is implemented for TAS, and, during write operations, the application of currents results in heating that allows one set of magnetizations of the MRAM cells 102a, 102b, 102c, and 102d to be varied, namely storage magnetizations of respective ones of the MRAM cells 102a, 102b, 102c, and 102d. As further explained below, such heating is at least partially achieved through the operation of the strap 106 and, in particular, through the application of a current through the strap 106 to heat the magnetic tunnel junctions that are adjacent to and thermally coupled to the strap 106. The implementation of such heating or warming strap allows a reduction in a magnitude of currents passing through the magnetic tunnel junctions during write operations, thereby alleviating stresses on the magnetic tunnel junctions and increasing a durability and operational life of the MRAM device 100.

The strap 106 includes a set of strap portions, namely strap portions 108 and 110. Bottom ends of the MRAM cells 102a, 102b, 102c, and 102d are electrically coupled to the strap 106, with the strap portion 108 extending laterally away from a center or midpoint of the strap 106 along one direction and electrically coupling the bottom ends of the MRAM cells 102a, 102b, 102c, and 102d to a selection transistor 112 through a contact stud 114. The strap portion 110 extends laterally away from the strap portion 108 in a substantially opposite direction, and electrically couples the bottom ends of the MRAM cells 102a, 102b, 102c, and 102d to another selection transistor 116 through a contact stud 118. The inclusion of the pair of selection transistors 112 and 116 provides improved control over current flow through the strap 106, although it is contemplated that at least one of the selection transistors 112 and 116 can be omitted. Other implementations of the strap 106 are contemplated, and, in particular, the orientation and the number of the strap portions 108 and 110 can be varied from that illustrated in FIG. 1A and FIG. 1B. Also, although not illustrated in FIG. 1A and FIG. 1B, at least one of the strap portions 108 and 110 can be electrically coupled to a current or voltage source, and a cladding can be included adjacent to an exterior of the strap 106 to attenuate undesired magnetic fields induced by current flow through the strap 106. Such a cladding can be omitted or reconfigured for other implementations, such as those including an active, heating strap as further explained below.

Referring to FIG. 1A and FIG. 1B, the MRAM device 100 also includes a set of traces or strip conductors to provide write and read functionality. Specifically, a set of field lines 120a, 120b, 120c, and 120d extend across the array of the MRAM cells 102a, 102b, 102c, and 102d in a substantially parallel fashion relative to one another and in a substantially orthogonal fashion relative to the strap 106, with the field lines 120a, 120b, 120c, and 120d disposed below and magnetically coupled to respective ones of the MRAM cells 102a, 102b, 102c, and 102d. During write operations, the application of currents through the field lines 120a, 120b, 120c, and 120d induces magnetic fields that can vary the storage magnetizations of the MRAM cells 102a, 102b, 102c, and 102d. During read operations, the application of currents through the field lines 120a, 120b, 120c, and 120d induces magnetic fields that can vary another set of magnetizations of the MRAM cells 102a, 102b, 102c, and 102d, namely sense magnetizations of respective ones of the MRAM cells 102a, 102b, 102c, and 102d. While not illustrated in FIG. 1A and FIG. 1B, each of the field lines 120a, 120b, 120c, and 120d can include a cladding to concentrate a magnetic field towards a respective one of the MRAM cells 102a, 102b, 102c, and 102d.

The MRAM device 100 also includes a set of bit lines 122a, 122b, 122c, and 122d, which extend across the array in a substantially parallel fashion relative to one another and in a substantially parallel fashion relative to the field lines 120a, 120b, 120c, and 120d, with the bit lines 122a, 122b, 122c, and 122d disposed above and electrically coupled to respective ones of the MRAM cells 102a, 102b, 102c, and 102d. During write operations, the application of currents through the bit lines 122a, 122b, 122c, and 122d and through the magnetic tunnel junctions of the MRAM cells 102a, 102b, 102c, and 102d results in partial heating, which, as combined with additional, partial heating by the strap 106, allows the storage magnetizations to be varied. During read operations, the application of currents through the bit lines 122a, 122b, 122c, and 122d and through the magnetic tunnel junctions allows the determination of resistance values, which are indicative of a degree of alignment between the storage magnetizations and the sense magnetizations of the MRAM cells 102a, 102b, 102c, and 102d. As illustrated in FIG. 1A and FIG. 1B, the bit lines 122a, 122b, 122c, and 122d are electrically coupled to selection transistors 124a, 124b, 124c, and 124d, respectively, which allow selection of the bit lines 122a, 122b, 122c, and 122d during write and read operations.

Coordinated operation of the field lines 120a, 120b, 120c, and 120d, the bit lines 122a, 122b, 122c, and 122d, and the selection transistors 112, 116, 124a, 124b, 124c, and 124d allows a particular subset of the MRAM cells 102a, 102b, 102c, and 102d to be selectively addressed during write and read operations. For example, when the MRAM cell 102c is to be written, the bit line 122c can be selectively activated by switching the selection transistor 124c from a blocked mode (OFF) to a saturated mode (ON), the field line 120c can be selectively activated, and the strap 106 also can be activated by switching the selection transistors 112 and 116 to their saturated modes, thereby inducing a magnetic field in the vicinity of the MRAM cell 102c and allowing current flow through the magnetic tunnel junction 104 as well as current flow through the strap 106. In such manner, the MRAM cell 102c, which is disposed at an intersection of the field line 120c, the bit line 122c, and the strap 106, can be individually addressed. Other implementations of the field lines 120a, 120b, 120c, and 120d and the bit lines 122a, 122b, 122c, and 122d are contemplated. Specifically, the orientation, the positioning, and the number of these traces can be varied from that illustrated in FIG. 1A and FIG. 1B. For example, the field lines 120a, 120b, 120c, and 120d can be disposed above the bit lines 122a, 122b, 122c, and 122d, rather than below the bit lines 122a, 122b, 122c, and 122d as illustrated in FIG. 1A and FIG. 1B.

The following provides additional explanation regarding the implementation and advantages of the MRAM device 100. For ease of presentation, the following explanation is primarily directed to the MRAM cell 102c, although the explanation is also applicable to other MRAM cells included in the MRAM device 100. Specifically, the MRAM cells 102a, 102b, 102c, and 102d can be similarly implemented, and, therefore, aspects explained with respect to the MRAM cell 102c are similarly applicable to the remaining MRAM cells 102a, 102b, and 102d. However, it is also contemplated that the implementation of the MRAM cells 102a, 102b, 102c, and 102d can differ in some fashion, such as by implementing the MRAM cells 102a, 102b, 102c, and 102d with different cross-sectional areas or shapes.

Referring to FIG. 1A, the MRAM cell 102c includes the magnetic tunnel junction 104, which includes a pair of magnetic layers corresponding to a sense layer 126 and a storage layer 128. The magnetic tunnel junction 104 also includes a spacer layer 130 that is disposed between the sense layer 126 and the storage layer 128. As illustrated in FIG. 1A, the bit line 122c is electrically coupled to a top end of the magnetic tunnel junction 104 on the side of the sense layer 126 and is substantially parallel to the field line 120c, which is disposed below and magnetically coupled to the bottom end of the magnetic tunnel junction 104 on the side of the storage layer 128. The MRAM device 100 also includes the selection transistors 112 and 116, which are electrically coupled, through the strap 106, to the magnetic tunnel junction 104 on the side of the storage layer 128. Other implementations of the MRAM cell 102c are contemplated. For example, the relative positioning of the sense layer 126 and the storage layer 128 can be reversed in the magnetic tunnel junction 104, with the storage layer 128 disposed above the sense layer 126.

Each of the sense layer 126 and the storage layer 128 includes, or is formed of, a magnetic material and, in particular, a magnetic material of the ferromagnetic type. A ferromagnetic material can be characterized by a substantially planar magnetization with a particular coercivity, which is indicative of a magnitude of a magnetic field to reverse the magnetization after it is driven to saturation in one direction. In general, the sense layer 126 and the storage layer 128 can include the same ferromagnetic material or different ferromagnetic materials. As illustrated in FIG. 1A, the sense layer 126 includes a soft ferromagnetic material, namely one having a relatively low coercivity, such as no greater than about 0.01 oersted, while the storage layer 128 includes a hard ferromagnetic material, namely one having a relatively high coercivity, such as greater than about 0.01 oersted. In such manner, a magnetization of the sense layer 126 can be readily varied under low-intensity magnetic fields during read operations, while a magnetization of the storage layer 128 remains stable. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or $Ni_{80}Fe_{20}$); alloys based on Ni, Fe, and boron ("B"); $Co_{90}Fe_{10}$; and alloys based on Co, Fe, and B. In some instances, alloys based on Ni and Fe (and optionally B) can have a smaller coercivity than alloys based on Co and Fe (and optionally B). A thickness of each of the sense layer 126 and the storage layer 128 can be in the nanometer ("nm") range, such as from about 1 nm to about 20 nm or from about 1 nm to about 10 nm. Other implementations of the sense layer 126 and the storage layer 128 are contemplated. For example, either, or both, of the sense layer 126 and the storage layer 128 can include multiple sub-layers in a fashion similar to that of the so-called synthetic antiferromagnetic layer.

The spacer layer 130 functions as a tunnel barrier and includes, or is formed of, an insulating material. Suitable insulating materials include oxides, such as aluminum oxide (e.g., $Al_2O_3$) and magnesium oxide (e.g., MgO). A thickness of the spacer layer 130 can be in the nm range, such as from about 1 nm to about 10 nm.

Referring to FIG. 1A, the MRAM cell 102c is implemented as a single-bit cell that stores a binary data value. In accordance with the single-bit implementation of the MRAM cell 102c, the storage layer 128 has a storage magnetization direction that is switchable between a pair of distinct directions according to a write encoding scheme, such as in which one direction is assigned to a high logic state "1", and a substantially opposite direction is assigned to a low logic state "0". As illustrated in FIG. 1A, the magnetic tunnel junction 104 includes a pinning layer 132, which is disposed adjacent to the storage layer 128 and is characterized by a threshold temperature $T_{BS}$ that can correspond to a blocking temperature, a Neel temperature, or another threshold temperature. Through exchange bias, the pinning layer 132 stabilizes the storage magnetization along an initial direction when a temperature within, or in the vicinity of, the pinning layer 132 is lower than the threshold temperature $T_{BS}$. The pinning layer 132 unpins, or decouples, the storage magnetization when the temperature is at, or above, the threshold temperature $T_{BS}$, thereby allowing the storage magnetization to be switched to another direction. In contrast, such a pinning layer is omitted adjacent to the sense layer 126, and, as a result, the sense layer 126 has a sense magnetization direction that is unpinned and is readily varied, with the substantial absence of exchange bias.

The pinning layer 132 includes, or is formed of, a magnetic material and, in particular, a magnetic material of the antiferromagnetic type. Suitable antiferromagnetic materials include transition metals and their alloys, including alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). In some instances, the threshold temperature $T_{BS}$ of alloys based on Ir and Mn (or based on Fe and Mn) can be in the range of about 120° C. to about 220° C. or about 150° C. to about 200° C., and can be smaller than the threshold temperature $T_{BS}$ of alloys based on Pt and Mn (or based on Ni and Mn), which can be in the range of about 300° C. to about 350° C. Because the sense magnetization direction is unpinned, the threshold temperature $T_{BS}$ can be selected to accommodate a desired application, such as a high temperature application, in the absence of, or without regard to, another threshold temperature that would otherwise set an upper bound of an operating temperature window.

During a TAS-type write operation of the MRAM device 100 as illustrated in FIG. 1A, the magnetic tunnel junction 104 is heated by the combined effect of a pair of contributions. Specifically, one contribution involves Joule heating and heating from tunneling electrons, and is carried out by applying a heating current 134 through the magnetic tunnel junction 104 via the bit line 122c, with the selection transistors 116 and 124c in their saturated modes. Another contribution involves Joule heating, and is carried out by applying another heating current 136 through the strap 106 and between the strap portions 108 and 110, with the selection transistors 112 and 116 in their saturated modes. As illustrated in FIG. 1A, the heating currents 134 and 136 merge to form a combined heating current 138 that passes through the strap portion 110 and the selection transistor 116. As a result of this pair of heating contributions, the magnetic tunnel junction 104 is heated to a temperature at, or above, the threshold temperature $T_{BS}$, such that the storage magnetization direction is unpinned. Simultaneously or after a short time delay, the field line 120c is activated to induce a write magnetic field to switch the storage magnetization direction from an initial direction to another direction. Specifically, a write current 140 is applied through the field line 120c to induce the write magnetic field to switch the storage magnetization direction accordingly.

By providing at least partial heating through the strap 106, the illustrated embodiment achieves the desired heating relative to the threshold temperature $T_{BS}$, while reducing a magnitude of the heating current 134 passing through the magnetic tunnel junction 104 to alleviate stresses on the magnetic tunnel junction 104. The heating contribution from the strap 106 can be increased or otherwise adjusted by suitable selection and control over a resistivity of the strap portions 108 and 110. For example, the resistivity of the strap portions 108 and 110 can be increased by reducing a cross-sectional area of the strap portions 108 and 110, such as by reducing their thickness, reducing their width, or both. For certain implementations, the cross-sectional area of the strap portions 108 and 110 can be no greater than about $3 \times 10^{-11}$ cm$^2$, such as no greater than about $2 \times 10^{-11}$ cm$^2$ or no greater than about $1 \times 10^{-11}$ cm$^2$, and down to about $1 \times 10^{-12}$ cm$^2$ or less, resulting in a sheet resistance that is at least about 150 Ω/square, such as at least about 200 Ω/square or at least about 250 Ω/square, and up to about 500 Ω/square or more. As another example, the resistivity of the strap portions 108 and 110 can be increased by adjusting a cross-sectional shape of the strap portions 108 and 110, such as from a square shape to a relatively thin, rectangular shape. As a further example, the resistivity of the strap portions 108 and 110 can be increased through the use of resistive materials having a sheet resistance that is at least about 150 Ω/square, such as at least about 200 Ω/square or at least about 250 Ω/square, and up to about 500 Ω/square or more. For certain implementations, either, or both, of the strap portions 108 and 110 can include, or can be formed of, tantalum nitride having a sheet resistance of about 223 Ω/square, although other highly resistive materials are also suitable.

Optimizing the relative heating contributions from the strap 106 and from passing the heating current 134 through the magnetic tunnel junction 104 can involve balancing countervailing factors related to alleviating stresses on the spacer layer 130, power consumption, and heating efficiency. For example, although certain implementations can achieve heating solely through operation of the strap 106, a power consumption and a magnitude of the heating current 136 to achieve a desired level of heating can be greater than other implementations in which the strap 106 provides partial heating. In terms of providing partial heating, the heating current 136 can have a magnitude sufficient to heat the magnetic tunnel junction 104 to a temperature of at least about $0.5 \times T_{BS}$, such as at least about $0.6 \times T_{BS}$ or at least about $0.7 \times T_{BS}$, but less than $T_{BS}$, such as up to about $0.9 \times T_{BS}$ or up to about $0.95 \times T_{BS}$, with the heating current 134 providing additional, partial heating to heat the magnetic tunnel junction 104 to at least $T_{BS}$. Also, in terms of providing partial heating, the magnitude of the heating current 136 can be at least about 50 percent of a magnitude of the combined heating current 138, such as at least about 60 percent or at least about 70 percent, but less than 100 percent of the magnitude of the combined heating current 138, such as up to about 90 percent or up to about 95 percent.

Once the storage magnetization direction is switched to a written direction, the selection transistors 112, 116, and 124c are switched to their blocked modes to inhibit current flow through the magnetic tunnel junction 104 and through the strap 106, thereby cooling the magnetic tunnel junction 104. The write magnetic field can be maintained during cooling of the magnetic tunnel junction 104, and can be deactivated once the magnetic tunnel junction 104 has cooled below the threshold temperature $T_{BS}$. Because the storage magnetization direction is pinned by the exchange bias of the pinning layer 132, its orientation remains stable so as to retain the written data. By operating in a similar fashion, the remaining MRAM cells 102a, 102b, and 102d can be individually addressed in additional write cycles to sequentially write respective portions of a multi-bit data value into the MRAM cells 102a, 102b, 102c, and 102d, thereby allowing the multi-bit data value to be written into the MRAM device 100 on an array-by-array basis or a strap-by-strap basis.

During a read operation of the MRAM cell 102c as illustrated in FIG. 1B, the field line 120c is activated to induce a read magnetic field to vary the sense magnetization direction of the sense layer 126. Specifically, a read current 142 is applied through the field line 120c to induce the read magnetic field to vary the sense magnetization direction accordingly. Because the sense layer 126 is subject to little or no exchange bias, the sense magnetization direction can be readily varied under low-intensity magnetic fields and at a temperature below the threshold temperature $T_{BS}$, while the storage magnetization direction remains stable in the written direction. For certain implementations, the read operation of the MRAM cell 102c is carried out in multiple read cycles, in which the field line 120c is activated in a fashion that is compatible with a write encoding scheme. Because the sense magnetization direction can be aligned according to the read magnetic field, the sense magnetization direction can be successively switched between a pair of distinct directions according to the write encoding scheme.

As part of each read cycle, a degree of alignment between the storage magnetization direction and the sense magnetization direction is determined by applying a sense current 144 through the magnetic tunnel junction 104 via the bit line 122c, with the selection transistors 116 and 124c in their saturated modes. Measuring a resulting voltage across the magnetic tunnel junction 104 when the sense current 144 is applied yields a resistance value of the magnetic tunnel junction 104 for a particular read cycle and for a particular direction of the write encoding scheme. Alternatively, a resistance value can be determined by applying a voltage across the magnetic tunnel junction 104 and measuring a resulting current. When the respective magnetizations of the sense layer 126 and the storage layer 128 are antiparallel, a resistance value of the magnetic tunnel junction 104 typically corresponds to a maximum value, and, when the respective magnetizations are parallel, a resistance value of the magnetic tunnel junction 104 typically corresponds to a minimum value. When the respective magnetizations are between antiparallel and parallel, a resistance value of the magnetic tunnel junction 104 is typically between the maximum value and the minimum value. Resistance values for multiple read cycles are processed to determine which direction yielded a minimum resistance value, thereby yielding a stored data value based on which one of a pair of logic states is assigned to that direction. Processing of the resistance values can be carried out using a suitable controller in combination with, for example, a sample/hold circuit. By operating in a similar fashion, the remaining MRAM cells 102a, 102b, and 102d can be individually addressed in additional read cycles to determine respective portions of a multi-bit data value stored by the MRAM cells 102a, 102b, 102c, and 102d, thereby allowing the multi-bit data value to be read from the MRAM device 100 on an array-by-array basis or a strap-by-strap basis.

The read operation of the MRAM cell 102c explained above is self-referenced, since it can be carried out based on the relative alignment of magnetizations within the MRAM cell 102c, without requiring a comparison to a reference resistance value of a reference cell or a group of reference cells. The self-referenced implementation of the MRAM cell 102c allows the omission of a reference layer with a fixed magnetization and, therefore, allows the operation of the MRAM cell 102c in the absence of, or without regard to, an upper threshold temperature. In such manner, an operation temperature window of the MRAM cell 102c can be greatly expanded, such as to temperatures up to about 400° C. or more.

Other implementations of write and read operations are contemplated. For example and referring to FIG. 1A, multiple ones of the field lines 120a, 120b, 120c, and 120d and multiple ones of the bit lines 122a, 122b, 122c, and 122d can be activated to write multiples ones of the MRAM cells 102a, 102b, 102c, and 102d in parallel, thereby increasing a speed of writing. In such manner, a multi-bit data value, such as "1100", can be written into the MRAM cells 102a, 102b, 102c, and 102d in a single write cycle, with each one of the MRAM cells 102a, 102b, 102c, and 102d storing a respective portion of the multi-bit data value. As another example, the MRAM device 100 can include additional arrays of MRAM cells arranged adjacent to additional straps that are implemented in a similar fashion as illustrated in FIG. 1A. During a write operation, a multi-bit data value can be written into multiple arrays of MRAM cells in parallel, with each one of the arrays storing a respective portion of the multi-bit data value. During a read operation, the multi-bit data value can be read from the arrays in parallel, resulting in a faster speed of reading.

Figure 2:
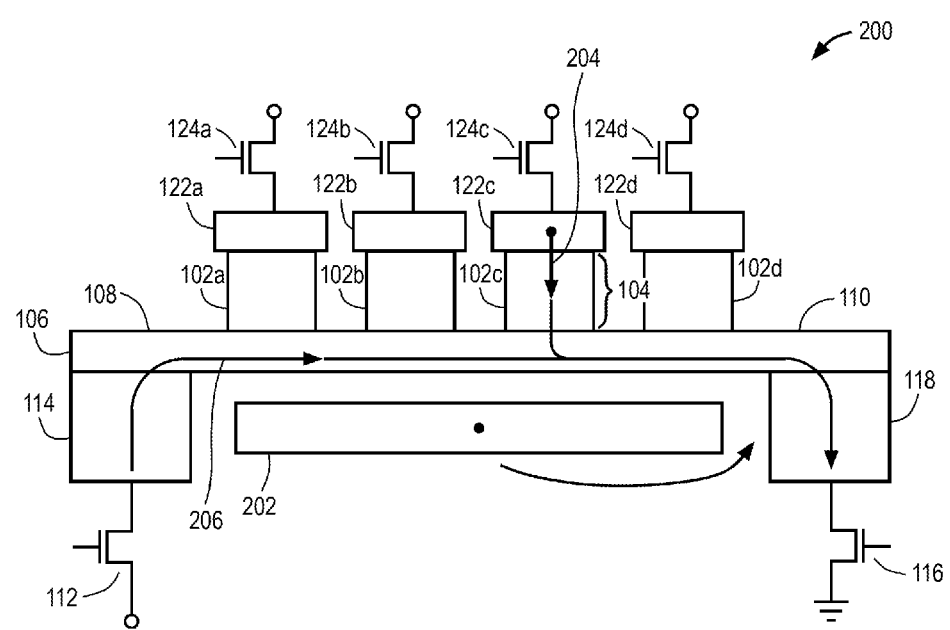
FIG. 2 illustrates a MRAM device implemented in accordance with another embodiment of the invention.

FIG. 2 illustrates a MRAM device 200 that is implemented in accordance with another embodiment of the invention. Certain aspects of the MRAM device 200 can be implemented in a similar fashion as previously explained for the MRAM device 100 of FIG. 1A and FIG. 1B, and those aspects are not repeated below.

Referring to FIG. 2, multiple field lines are combined into a common field line 202 that is magnetically coupled to, and shared by, the MRAM cells 102a, 102b, 102c, and 102d in the horizontal array. In other words, the MRAM device 200 includes one shared field line per array or per strap, rather than one field line per MRAM cell. The implementation of such shared field line further conserves valuable die area and further lowers manufacturing costs.

During a TAS-type write operation of the MRAM device 200 as illustrated in FIG. 2, the magnetic tunnel junction 104 is partially heated by applying a heating current 204 through the magnetic tunnel junction 104 via the bit line 122c, with the selection transistors 116 and 124c in their saturated modes. In combination, another heating current 206 is applied through the strap 106 and between the strap portions 108 and 110, with the selection transistors 112 and 116 in their saturated modes. As a result, the magnetic tunnel junction 104 is heated to a temperature at, or above, the threshold temperature $T_{BS}$, such that the storage magnetization direction is unpinned. Simultaneously or after a short time delay, the field line 202 is activated to induce a write magnetic field to switch the storage magnetization direction accordingly. By operating in a similar fashion, the remaining MRAM cells 102a, 102b, and 102d can be individually addressed in additional write cycles to sequentially write respective portions of a multi-bit data value into the MRAM cells 102a, 102b, 102c, and 102d. A read operation of the MRAM device 200 can be carried out in a similar fashion as previously explained for the MRAM device 100 of FIG. 1A and FIG. 1B.

Figure 3A:
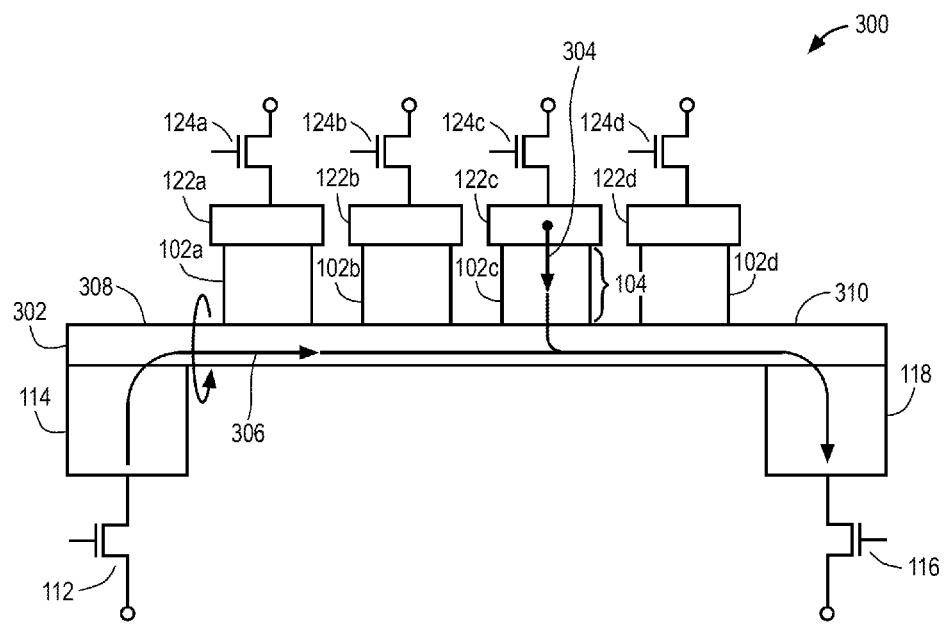
FIG. 3A and FIG. 3B illustrate a MRAM device implemented in accordance with another embodiment of the invention.
Figure 3B:
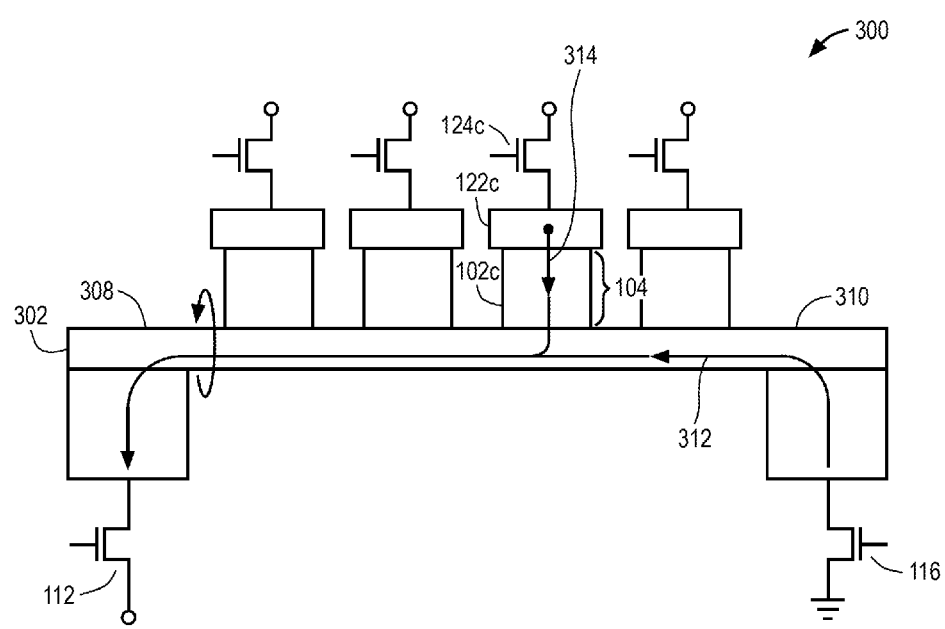

FIG. 3A and FIG. 3B illustrate a MRAM device 300 that is implemented in accordance with another embodiment of the invention. Certain aspects of the MRAM device 300 can be implemented in a similar fashion as previously explained for the MRAM devices 100 and 200 of FIG. 1A through FIG. 2, and those aspects are not repeated below.

The MRAM device 300 includes a strap 302, which is implemented as an active, heating strap to provide current flow to heat the MRAM cells 102a, 102b, 102c, and 102d during write operations, as well as to provide current flow to induce magnetic fields during write and read operations. In other words, the strap 302 also functions as a set of field lines, such that separate field lines can be omitted. The implementation of such active, heating strap further conserves valuable die area and further lowers manufacturing costs. Also, because of the close spacing of such active, heating strap relative to the magnetic tunnel junctions of the MRAM cells 102a, 102b, 102c, and 102d, switching efficiency of induced magnetic fields can be improved, thereby allowing low-intensity magnetic fields and reduced power consumption.

During a TAS-type write operation of the MRAM device 300 as illustrated in FIG. 3A, the magnetic tunnel junction 104 is partially heated by applying a heating current 304 through the magnetic tunnel junction 104 via the bit line 122c, with the selection transistors 116 and 124c in their saturated modes. In combination, another heating current 306 is applied through the strap 302 and between strap portions 308 and 310, with the selection transistors 112 and 116 in their saturated modes. As a result, the magnetic tunnel junction 104 is heated to a temperature at, or above, the threshold temperature $T_{BS}$, such that the storage magnetization direction is unpinned and is switched according to a write magnetic field induced by current flow through the strap 302. Next, the current flow through the strap 302 is reduced or throttled down to a level sufficient to allow cooling of the magnetic tunnel junction 104 while maintaining the write magnetic field during such cooling. The current flow through the magnetic tunnel junction 104 can be deactivated once the desired level of heating is achieved, or can be maintained for some period of time subsequent to achieving the desired level of heating. By operating in a similar fashion, the remaining MRAM cells 102a, 102b, and 102d can be individually addressed in additional write cycles to sequentially write respective portions of a multi-bit data value into the MRAM cells 102a, 102b, 102c, and 102d.

In the illustrated embodiment, the current flow through the strap 302 is bidirectional so as to allow a direction of an induced magnetic field to be reversed. Such bidirectionality can be achieved by, for example, reversing a voltage polarity between the strap portions 308 and 310. For example, and referring to a read cycle of the MRAM device 300 as illustrated in FIG. 3B, a read current 312 is applied so as to pass from the strap portion 310 towards the strap portion 308, thereby inducing a read magnetic field having a particular direction to vary the sense magnetization direction accordingly. In combination, a sense current 314 is applied through the magnetic tunnel junction 104 via the bit line 122c, thereby yielding a resistance value of the magnetic tunnel junction 104 for the read cycle. During another read cycle, a direction of the read current 312 is reversed so as to pass from the strap portion 308 towards the strap portion 310, thereby reversing the direction of the read magnetic field. In such fashion, the sense magnetization direction can be successively switched between a pair of distinct directions.

Figure 4A:
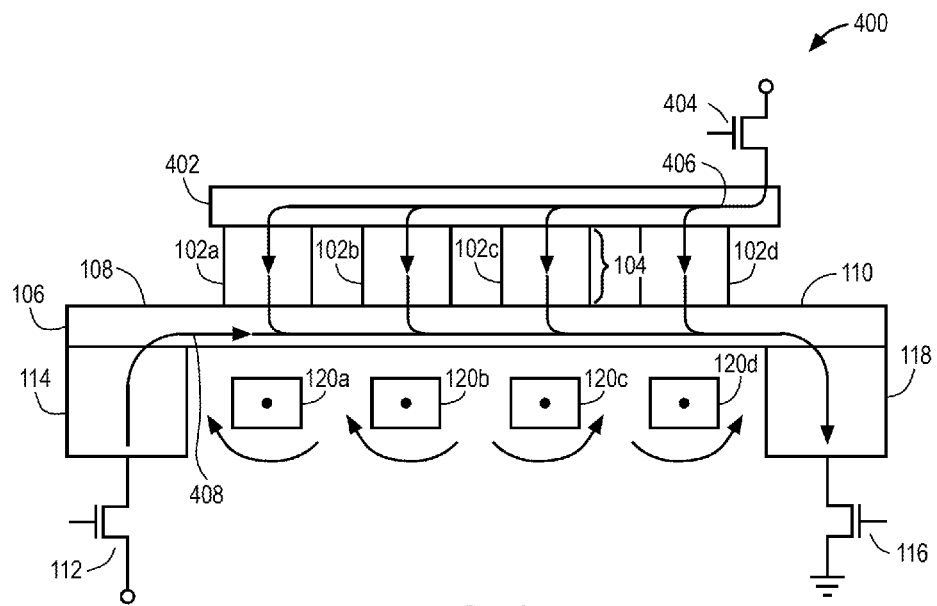
FIG. 4A and FIG. 4B illustrate a MRAM device implemented in accordance with another embodiment of the invention.
Figure 4B:
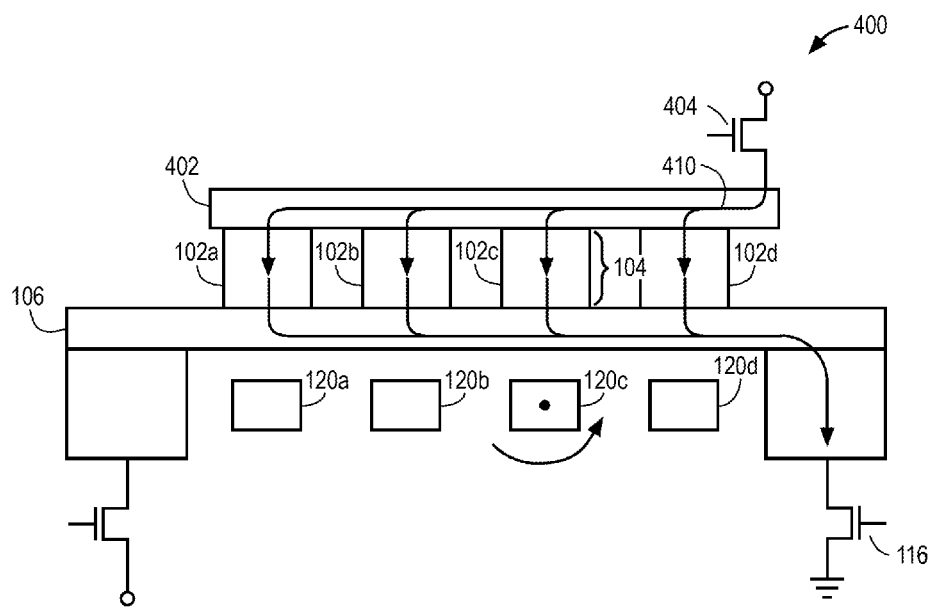

FIG. 4A and FIG. 4B illustrate a MRAM device 400 that is implemented in accordance with another embodiment of the invention. Certain aspects of the MRAM device 400 can be implemented in a similar fashion as previously explained for the MRAM devices 100, 200, and 300 of FIG. 1A through FIG. 3B, and those aspects are not repeated below.

Referring to FIG. 4A, the MRAM device 400 includes the MRAM cells 102a, 102b, 102c, and 102d, which are arranged in a horizontal array and in a side-by-side fashion between a bit line 402 and the strap 106. The bit line 402 extends across the array in a substantially parallel fashion relative to the strap 106 and in a substantially orthogonal fashion relative to the field lines 120a, 120b, 120c, and 120d, with the bit line 402 disposed above and electrically coupling the top ends of the MRAM cells 102a, 102b, 102c, and 102d to a selection transistor 404. The bit line 402 serves as a common bit line that is shared by the MRAM cells 102a, 102b, 102c, and 102d, and the selection transistor 404 serves as a common transistor that is shared by the MRAM cells 102a, 102b, 102c, and 102d. The implementation of such shared bit line and such shared transistor further conserves valuable die area and further lowers manufacturing costs. In the illustrated embodiment, the MRAM cells 102a, 102b, 102c, and 102d are electrically coupled in parallel between the bit line 402 and the strap 106, thereby allowing multiple ones of the MRAM cells 102a, 102b, 102c, and 102d to be written in parallel for an increased speed of writing. In addition, self-referenced implementation of the MRAM cells 102a, 102b, 102c, and 102d and the provision of variable sense magnetizations allow an individual one of the MRAM cells 102a, 102b, 102c, and 102d to be selected and individually probed, thereby facilitating read operations of the parallel-interconnected MRAM cells 102a, 102b, 102c, and 102d while retaining the benefits of increased writing speed.

During a TAS-type write operation of the MRAM device 400 as illustrated in FIG. 4A, the array of the parallel-interconnected MRAM cells 102a, 102b, 102c, and 102d is partially heated by applying a heating current 406 through the array via the bit line 402, with the selection transistors 116 and 404 in their saturated modes. In combination, another heating current 408 is applied through the strap 106 and between the strap portions 108 and 110, with the selection transistors 112 and 116 in their saturated modes. As illustrated in FIG. 4A, the heating current 406 splits into multiple portions that pass through respective ones of the MRAM cells 102a, 102b, 102c, and 102d, before merging with the heating current 408 within the strap 106. As a result of the combined contributions of the heating currents 406 and 408, the MRAM cells 102a, 102b, 102c, and 102d are heated to a temperature at, or above, the threshold temperature $T_{BS}$, such that their storage magnetization directions are unpinned. Simultaneously or after a short time delay, the field lines 120a, 120b, 120c, and 120d are activated to induce write magnetic fields to switch the storage magnetization directions accordingly. For example, the storage magnetization direction of the MRAM cell 102a can be switched from the logic state "0" to the logic state "1", the storage magnetization direction of the MRAM cell 102b can be switched from the logic state "0" to the logic state "1", the storage magnetization direction of the MRAM cell 102c can be switched from the logic state "1" to the logic state "0", and the storage magnetization direction of the MRAM cell 102d can be switched from the logic state "1" to the logic state "0". Once the storage magnetizations are switched to their written directions, the transistors 112, 116, and 404 are switched to their blocked modes to inhibit current flow through the MRAM cells 102a, 102b, 102c, and 102d and through the strap 106, thereby cooling the MRAM cells 102a, 102b, 102c, and 102d. In such fashion, a multi-bit data value, such as "1100", can be written into the MRAM cells 102a, 102b, 102c, and 102d in a single write cycle, with each one of the MRAM cells 102a, 102b, 102c, and 102d storing a respective portion of the multi-bit data value.

During a read operation of the MRAM device 400 as illustrated in FIG. 4B, an individual one of the MRAM cells 102a, 102b, 102c, and 102d is selectively addressed to determine a respective portion of a multi-bit data value stored by that MRAM cell. In the case that the MRAM cell 102c is read, for example, the field line 120c is activated to induce a read magnetic field to vary the sense magnetization direction of the MRAM cell 102c. During the read operation of the MRAM cell 102c, the field lines 120a, 120b, and 120d can remain deactivated to reduce power consumption, and the sense magnetization directions of the MRAM cells 102a, 102b, and 102d can remain substantially unchanged, other than possible variations resulting from thermal agitation and possible interactions with the read magnetic field induced by the field line 120c.

In the illustrated embodiment, the read operation of the MRAM cell 102c is carried out in multiple read cycles, in which the field line 120c is activated in a fashion that is compatible with a write encoding scheme. As part of each read cycle, a degree of alignment between the storage magnetization direction and the sense magnetization direction of the MRAM cell 102c is determined by applying a sense current 410 through the array of the parallel-interconnected MRAM cells 102a, 102b, 102c, and 102d via the bit line 402, with the selection transistors 116 and 404 in their saturated modes. As illustrated in FIG. 4B, the sense current 410 splits into multiple portions that pass through respective ones of the MRAM cells 102a, 102b, 102c, and 102d, before recombining within the strap 106. Measuring a resulting voltage (or a resulting current) across the array yields a resistance value of the array for a particular read cycle and for a particular direction of the write encoding scheme. The resistance value of the array includes a parallel resistance contribution of the MRAM cells 102a, 102b, 102c, and 102d, in which the sense magnetization direction of the MRAM cell 102c is switched, while the sense magnetization directions of the MRAM cells 102a, 102b, and 102d remain substantially unchanged. When the storage magnetization direction and the sense magnetization direction of the MRAM cell 102c are antiparallel, the parallel resistance contribution of the MRAM cells 102a, 102b, 102c, and 102d typically has a maximum value, such as a local maximum value, and, when the magnetizations of the MRAM cell 102a are parallel, the parallel resistance contribution of the MRAM cells 102a, 102b, 102c, and 102d typically has a minimum value, such as a local minimum value. Resistance values for multiple read cycles are processed to determine which direction yielded a minimum resistance value, thereby yielding a written direction of the MRAM cell 102c and its stored portion of a multi-bit data value. By operating in a similar fashion, the remaining MRAM cells 102a, 102b, and 102d can be individually addressed in additional read cycles to determine respective portions of the multi-bit data value stored by the MRAM cells 102a, 102b, 102c, and 102d.

Other implementations of read operations are contemplated. For example, during the read operation of the MRAM cell 102c, the sense magnetization direction of the MRAM cell 102c can be varied, with the field lines 120a, 120b, and 120d activated to align the sense magnetization directions of the remaining MRAM cells 102a, 102b, and 102d along a predetermined read direction, such as along one of a pair of directions of a write encoding scheme. In such manner, the MRAM cell 102c can be read, while reducing the impact of variations of the sense magnetization directions of the remaining MRAM cells 102a, 102b, and 102d. As another example, a multi-bit data value can be written into multiple arrays of MRAM cells in parallel, with each one of the arrays storing a respective portion of the multi-bit data value. During a read operation, the multi-bit data value can be read from the arrays in parallel, resulting in a faster speed of reading.

It should be understood that the embodiments explained above are provided by way of example, and other embodiments are contemplated. For example and referring to FIG. 1A, at least one of the MRAM cells 102a, 102b, 102c, and 102d can be characterized by a reference magnetization with a substantially fixed direction. In the case of the MRAM cell 102c, for example, a reference layer can be substituted in place of the sense layer 126, and a reference magnetization can be stabilized along a substantially fixed direction by another pinning layer, which can be disposed adjacent to the reference layer and can be characterized by an upper threshold temperature $T_{BR} > T_{BS}$.

Figure 5:
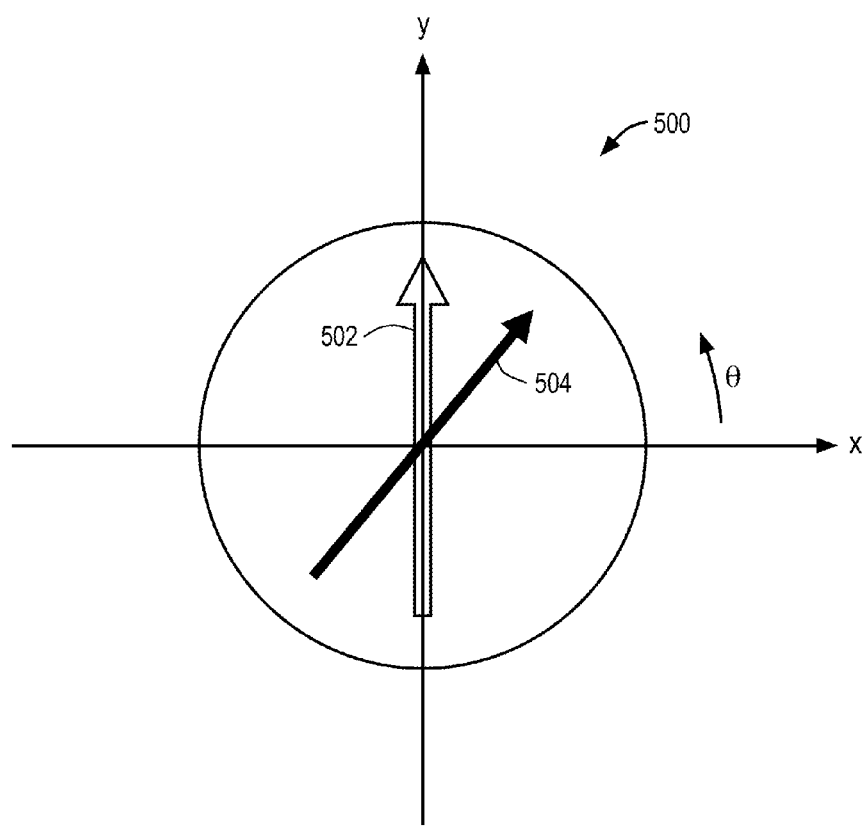
FIG. 5 illustrates a multi-bit MRAM cell implemented in accordance with a further embodiment of the invention.

As another example, a TAS-type implementation of at least one of the MRAM cells 102a, 102b, 102c, and 102d can be further extended by including functionality to write and read multiple bits per cell, such as by using magnetizations that can be rotated in two dimensions. FIG. 5 illustrates such a MRAM cell 500, according to a further embodiment of the invention. Specifically, the MRAM cell 500 is implemented to store data corresponding to m logic states, with m>2. In other words, the MRAM cell 500 is a multi-bit cell that stores a multi-bit data value. Referring to FIG. 5, the MRAM cell 500 has a storage magnetization 502 that is switchable between m directions (and between m angles) corresponding to the m logic states, according to a set of bits to be stored. In addition, the MRAM cell 500 has a sense magnetization 504 that is switchable between the m directions (and between the m angles) corresponding to the m logic states. The stored set of bits can be determined based on a relative alignment between the storage magnetization 502 and the sense magnetization 504.

For certain implementations, m can be represented as $m=2^n$, with $n \geq 2$. Here, the MRAM cell 500 is an n-bit cell that stores an n-bit data value. One possible write encoding scheme assigning m logic states to m distinct angles θ is set forth in Table 1 below. A particular encoding scheme can be selected based on an angular resolution that allows alignment and misalignment of magnetizations to be distinguished. For example, if a resolution of resistance values is 90°, one possible encoding scheme assigning four logic states to four distinct angles θ is set forth in Table 2 below. As additional examples, a 45° resolution can be implemented with an encoding scheme with m=8 and n=3, a 22.5° resolution can be implemented with an encoding scheme with m=16 and n=4, and so forth. It should be understood that other encoding schemes are contemplated. For example, and referring to Table 2, the assignment between m logic states and m angles θ can be permuted, such that the logic state "00" is assigned to 90° (instead of 0°), the logic state "01" is assigned to 0° (instead of 90°), and so forth. As another example, an offset can be added to some, or all, of the angles θ, such that the logic state "00" is assigned to 0°+offset, the logic state "01" is assigned to 90°+offset, and so forth. As further examples, an increment between successive angles θ can be variable, rather than a constant, and certain of the m logic states and certain of the m angles θ can be omitted.

TABLE 1

| Logic State/<br>n-bit data | θ |
|---|---|
| 0 . . . 00 | 0° |
| 0 . . . 01 | $360°/2^n$ |
| 0 . . . 10 | $2(360°/2^n)$ |
| 0 . . . 11 | $3(360°/2^n)$ |
| . . . | . . . |

TABLE 2

| Logic State/<br>2-bit data | θ |
|---|---|
| 00 | 0° |
| 01 | 90° |
| 10 | 180° |
| 11 | 270° |

The multi-bit MRAM cell 500 can be implemented in a similar fashion as illustrated for the MRAM cell 102c of FIG.

1A, and including another field line that is disposed above, or below, the bit line 122c and that is substantially orthogonal to the field line 120c. During a write operation, at least one of the field line 120c and the other field line is activated to induce a set of magnetic fields to switch the storage magnetization 502 to a particular one of the m directions. Likewise, during a read operation, at least one of the field line 120c and the other field line is activated to induce a set of magnetic fields to successively switch the sense magnetization 504 between the m directions. Other implementations of a multi-bit MRAM cell are contemplated. For example, and referring to FIG. 1A, the strap 106 can be implemented as an active, heating strap, and can function as the other field line.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A memory device comprising:
   a plurality of magnetic random access memory (MRAM) cells each including a first end and a second end;
   a bit line electrically coupled to the first end of at least one of the MRAM cells; and
   a strap electrically coupled to the second end of each one of the MRAM cells,
   wherein, during a write operation, the bit line is configured to apply a first heating current, and the strap is configured to apply a second heating current, such that at least one of the MRAM cells is heated to at least a threshold temperature according to the first heating current and the second heating current; and
   wherein the strap includes a first strap portion and a second strap portion that extends from the first strap portion, and the strap is configured to apply the second heating current between the first strap portion and the second strap portion.

2. The memory device of claim 1, wherein the MRAM cells are arranged in a horizontal array adjacent to the strap.

3. The memory device of claim 1, wherein a sheet resistance of the strap is at least 200 Ω/square.

4. The memory device of claim 1, wherein a cross-sectional area of the strap is no greater than $3 \times 10^{-11}$ cm$^2$.

5. The memory device of claim 1, wherein a magnitude of the second heating current is at least 50 percent but less than 100 percent of a magnitude of the combined heating current.

6. The memory device of claim 1, further comprising a first selection transistor, and the first strap portion electrically couples the second end of each one of the MRAM cells to the first selection transistor.

7. The memory device of claim 6, further comprising a second selection transistor, and the second strap portion electrically couples the second end of each one of the MRAM cells to the second selection transistor.

8. The memory device of claim 1, further comprising a plurality of field lines magnetically coupled to respective ones of the MRAM cells, wherein each one of the MRAM cells has a storage magnetization direction, and, during the write operation, at least one of the field lines is configured to apply a write current to induce a write magnetic field, such that the storage magnetization direction of at least one of the MRAM cells is switched according to the write magnetic field.

9. The memory device of claim 8, wherein, during the write operation, each one of the field lines is configured to apply a write current to induce a write magnetic field, such that the MRAM cells are written in parallel.

10. The memory device of claim 9, wherein the bit line is electrically coupled to the first end of each one of the MRAM cells, and, during the write operation, the bit line is configured to apply respective portions of the first heating current through the MRAM cells.

11. The memory device of claim 1, wherein each one of the MRAM cells has a storage magnetization direction and a sense magnetization direction, and, during a read operation, a particular one of the MRAM cells is configured to be read by varying the sense magnetization direction of the particular one of the MRAM cells, relative to the storage magnetization direction of the particular one of the MRAM cells.

12. A memory device comprising:
   a plurality of magnetic random access memory (MRAM) cells each including a first end and a second end;
   a bit line electrically coupled to the first end of at least one of the MRAM cells;
   a strap electrically coupled to the second end of each one of the MRAM cells; and
   a plurality of field lines magnetically coupled to respective ones of the MRAM cells,
   wherein, during a write operation, the bit line is configured to apply a first heating current, and the strap is configured to apply a second heating current, such that at least one of the MRAM cells is heated to at least a threshold temperature according to the first heating current and the second heating current;
   wherein each one of the MRAM cells has a storage magnetization direction and a sense magnetization direction, and, during a read operation, a particular one of the MRAM cells is configured to be read by varying the sense magnetization direction of the particular one of the MRAM cells, relative to the storage magnetization direction of the particular one of the MRAM cells; and
   wherein, during the read operation, a particular one of the field lines is selectively activated to apply a read current to induce a read magnetic field, such that the sense magnetization direction of the particular one of the MRAM cells being read is varied in accordance with the read magnetic field.

13. A memory device comprising:
   a plurality of magnetic random access memory (MRAM) cells each including a first end and a second end;
   a bit line electrically coupled to the first end of at least one of the MRAM cells; and
   a strap electrically coupled to the second end of each one of the MRAM cells;
   wherein, during a write operation, the bit line is configured to apply a first heating current, and the strap is configured to apply a second heating current, such that at least one of the MRAM cells is heated to at least a threshold temperature according to the first heating current and the second heating current;

wherein each one of the MRAM cells has a storage magnetization direction and a sense magnetization direction, and, during a read operation, a particular one of the MRAM cells is configured to be read by varying the sense magnetization direction of the particular one of the MRAM cells, relative to the storage magnetization direction of the particular one of the MRAM cells; and wherein, during the read operation, the strap is configured to apply a read current through the strap to induce a read magnetic field, such that the sense magnetization direction of the particular one of the MRAM cells being read is varied in accordance with the read magnetic field.

14. A method of operating a memory device, comprising:
providing a plurality of magnetic random access memory (MRAM) cells and a strap thermally coupled to each one of the MRAM cells; and
during a write operation,
heating each one of the MRAM cells to at least a threshold temperature such that storage magnetization directions of the MRAM cells are temporarily unpinned, wherein heating the MRAM cells includes applying a heating current through the strap; and
switching the storage magnetization directions of the MRAM cells to store a multi-bit data value;
wherein heating the MRAM cells further includes applying another heating current through at least one of the MRAM cells; and
wherein the threshold temperature corresponds to $T_{BS}$, and applying the heating current through the strap generates sufficient heat to raise a temperature of at least one of the MRAM cells to at least $0.6 \times T_{BS}$ but less than $T_{BS}$.

15. The memory device of claim 1, wherein the bit line and the strap are configured such that the first heating current flows from the bit line to the strap and merges with the second heating current to form a combined heating current that passes through at least a portion of the strap.

16. The memory device of claim 1, wherein each one of the MRAM cells has a storage magnetization direction, and, during the write operation, the bit line is configured to apply the first heating current through a particular one of the MRAM cells, and the strap is configured to apply the second heating current through the strap to induce a write magnetic field, such that the storage magnetization direction of the particular one of the MRAM cells is switched according to the write magnetic field.

17. The memory device of claim 1, further comprising a plurality of field lines magnetically coupled to respective ones of the MRAM cells, wherein:
each one of the MRAM cells has a storage magnetization direction, and, during the write operation, at least one of the field lines is configured to apply a write current to induce a write magnetic field, such that the storage magnetization direction of at least one of the MRAM cells is switched according to the write magnetic field; and
during the write operation, each one of the field lines is configured to apply a write current to induce a write magnetic field, such that the MRAM cells are written in parallel.

18. The memory device of claim 12, wherein the bit line and the strap are configured such that the first heating current flows from the bit line to the strap and merges with the second heating current to form a combined heating current that passes through at least a portion of the strap.

19. The memory device of claim 12, wherein each one of the MRAM cells has a storage magnetization direction, and, during the write operation, the bit line is configured to apply the first heating current through a particular one of the MRAM cells, and the strap is configured to apply the second heating current through the strap to induce a write magnetic field, such that the storage magnetization direction of the particular one of the MRAM cells is switched according to the write magnetic field.

20. The memory device of claim 12, further comprising a plurality of field lines magnetically coupled to respective ones of the MRAM cells, wherein:
each one of the MRAM cells has a storage magnetization direction, and, during the write operation, at least one of the field lines is configured to apply a write current to induce a write magnetic field, such that the storage magnetization direction of at least one of the MRAM cells is switched according to the write magnetic field; and
during the write operation, each one of the field lines is configured to apply a write current to induce a write magnetic field, such that the MRAM cells are written in parallel.

21. The memory device of claim 13, wherein the bit line and the strap are configured such that the first heating current flows from the bit line to the strap and merges with the second heating current to form a combined heating current that passes through at least a portion of the strap.

22. The memory device of claim 13, wherein each one of the MRAM cells has a storage magnetization direction, and, during the write operation, the bit line is configured to apply the first heating current through a particular one of the MRAM cells, and the strap is configured to apply the second heating current through the strap to induce a write magnetic field, such that the storage magnetization direction of the particular one of the MRAM cells is switched according to the write magnetic field.

23. The memory device of claim 13, further comprising a plurality of field lines magnetically coupled to respective ones of the MRAM cells, wherein:
each one of the MRAM cells has a storage magnetization direction, and, during the write operation, at least one of the field lines is configured to apply a write current to induce a write magnetic field, such that the storage magnetization direction of at least one of the MRAM cells is switched according to the write magnetic field; and
during the write operation, each one of the field lines is configured to apply a write current to induce a write magnetic field, such that the MRAM cells are written in parallel.

24. The method of claim 14, wherein the another heating current is through a bit line electrically coupled to at least one of the MRAM cells.

25. The method of claim 14, wherein the another heating current is through a common bit line electrically coupled to the each one of the MRAM cells.

* * * * *